(12) United States Patent
Horita

(10) Patent No.: US 10,277,200 B2
(45) Date of Patent: Apr. 30, 2019

(54) ATTENUATOR AND HIGH FREQUENCY CIRCUIT

(71) Applicant: Murata Manufacturing Co., Ltd., Kyoto (JP)

(72) Inventor: Atsushi Horita, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 34 days.

(21) Appl. No.: 15/349,029

(22) Filed: Nov. 11, 2016

(65) Prior Publication Data

US 2017/0063343 A1   Mar. 2, 2017

Related U.S. Application Data

(63) Continuation of application No. PCT/JP2015/065181, filed on May 27, 2015.

(30) Foreign Application Priority Data

Jun. 6, 2014   (JP) .................................. 2014-117186

(51) Int. Cl.
*H03H 7/24*   (2006.01)
*H03H 11/24*   (2006.01)
(Continued)

(52) U.S. Cl.
CPC ............... *H03H 11/24* (2013.01); *H01G 7/00* (2013.01); *H01G 7/06* (2013.01); *H03H 7/25* (2013.01); *H03H 11/20* (2013.01); *H04B 1/40* (2013.01)

(58) Field of Classification Search
None
See application file for complete search history.

(56) References Cited

U.S. PATENT DOCUMENTS 4,062,042 A * 12/1977 Ott .................... H03G 1/0029
                                                                  327/308
2006/0269186 A1   11/2006 Frame et al.
(Continued)

FOREIGN PATENT DOCUMENTS

JP   H07-154279 A    6/1995
JP   H07154279 A  *  6/1995
(Continued)

OTHER PUBLICATIONS

Skyworks Solutions, "Design With Pin Diodes", http://www.skyworksinc.com/uploads/documents/Design_With_PIN_Diodes_200312D.pdf, dated Oct. 22, 2012.
(Continued)

*Primary Examiner* — Long Nguyen
(74) *Attorney, Agent, or Firm* — Pearne & Gordon LLP

(57) ABSTRACT

An attenuator includes a first high frequency signal input-output terminal and a second high frequency signal input-output terminal, a switch circuit, a plurality of resistors, and a variable capacitor. The plurality of resistors are respectively connected to the first high frequency signal input-output terminal while the resistors being parallel to each other. The switch circuit includes a plurality of selection target terminals respectively connected to the resistors and a shared terminal to which the plurality of selection target terminals are selectively connected and which is connected to the second high frequency signal input-output terminal. The variable capacitor is connected to one of the resistors in series and is so constituted as to have not a diode structure.

11 Claims, 3 Drawing Sheets

(51) Int. Cl.
    *H01G 7/00*     (2006.01)
    *H01G 7/06*     (2006.01)
    *H03H 7/25*     (2006.01)
    *H04B 1/40*     (2015.01)
    *H03H 11/20*    (2006.01)

(56) References Cited

U.S. PATENT DOCUMENTS

2007/0165746 A1*  7/2007  Maeda ................ H03G 1/0088
                                                      375/297
2010/0149722 A1*  6/2010  Floyd .................. G02B 26/001
                                                      361/281
2011/0150069 A1   6/2011  Jamin et al.
2013/0214616 A1   8/2013  Farbiz et al.

FOREIGN PATENT DOCUMENTS

JP    2003-168947 A    6/2003
JP    2008206129 A     9/2008
JP    2010068379 A     3/2010
JP    2012095257 A     5/2012
JP    2013239839 A    11/2013
WO    2013098998 A1    7/2013

OTHER PUBLICATIONS

International Search Report for PCT/JP2015/065181 dated Jul. 21, 2015.
Written Opinion for PCT/JP2015/065181 dated Jul. 21, 2015.

* cited by examiner

ATTENUATOR AND HIGH FREQUENCY CIRCUIT

This application is a continuation of International Application No. PCT/JP2015/065181 filed on May 27, 2015 which claims priority from Japanese Patent Application No. 2014-117186 filed on Jun. 6, 2014. The contents of these applications are incorporated herein by reference in their entireties.

BACKGROUND

Technical Field

The present disclosure relates to attenuators configured to attenuate high frequency signals, and particularly relates to an attenuator capable of adjusting attenuation and a high frequency circuit including the stated attenuator.

As a typical variable attenuator, such an attenuator that uses a 90° hybrid circuit and a PIN diode as disclosed in Non-Patent Document 1 has been known.

In a variable attenuator disclosed in Non-Patent Document 1, PIN diodes are connected between the ground and two terminals different from an input terminal of a high frequency signal and an output terminal of a high frequency signal in a 90° hybrid circuit. By adjusting a voltage applied to each PIN diode, the variable attenuator disclosed in Non-Patent Document 1 changes a resistance component of the PIN diode. Attenuation of the high frequency signal is changed in accordance with the change of the resistance component of the PIN diode.

Non-Patent Document 1: Application Notes/Design with PIN diode, SKYWORKS Solutions, Home Page http://www.skyworksinc.com/uploads/documents/Design_With_PIN_Diodes_200312D.pdf

BRIEF SUMMARY

However, because the above existing variable attenuator uses PIN diodes, in the case where a high frequency signal of high power (a transmission signal, for example) is inputted, distortion is generated in an "I" layer, thereby degrading IMD characteristics (intermodulation distortion characteristics).

In addition, because the above existing variable attenuator uses a 90° hybrid circuit, a formation region is likely to be restricted.

As such, the present disclosure provides an attenuator that can be simply and easily formed and can adjust attenuation without necessarily harmonic distortion being generated, and provide a high frequency circuit including the stated attenuator.

An attenuator of the present disclosure includes a first high frequency signal input-output terminal and a second high frequency signal input-output terminal, a plurality of resistors, a switch circuit, and a variable reactance portion. The plurality of resistors are respectively connected to the first high frequency signal input-output terminal while the resistors being parallel to each other. The switch circuit includes a plurality of selection target terminals respectively connected to each of the resistors, and a shared terminal to which the plurality of selection target terminals are selectively connected and which is connected to the second high frequency signal input-output terminal. The variable reactance portion is connected to at least one of the plurality of resistors.

Employing this configuration makes it possible to suppress high harmonic distortion and realize a variable attenuator configured simply and easily.

The variable reactance portion of the present disclosure can be configured of a variable capacitor that does not have a diode structure. In this configuration, a specific example of the variable reactance portion is cited, and using the cited variable capacitor makes it possible to realize the variable reactance portion in a relatively easy manner.

The attenuator of the present disclosure can have one of the following configurations: that is, a configuration in which the switch circuit selects one of the plurality of selection target terminals and connects the selected target terminal to the shared terminal; or a configuration in which the switch circuit connects at least two of the plurality of selection target terminals to the shared terminal at the same time.

With this constitution, types of impedance capable of being realized can be increased.

The variable capacitor of the attenuator of the present disclosure can be constituted of BST or MEMS. With this constitution, the variable capacitor and the attenuator can be more easily realized.

A high frequency circuit of the present disclosure includes the attenuator as defined in any one of the foregoing descriptions, a phase adjustment circuit, a first coupler configured to distribute an inputted high frequency signal to a main signal and to a noise cancel signal, and a second coupler configured to combine the main signal and the noise cancel signal and output the combined signal. The phase adjustment circuit and the attenuator are inserted in a transmission path for the noise cancel signal.

With this configuration, the noise cancel signal can be made to have a desired amplitude and a desired phase, whereby a high level of noise cancel effect can be obtained.

Moreover, a high frequency circuit of the present disclosure includes the attenuator as defined in any one of the foregoing descriptions, a phase adjustment circuit, a first coupler configured to distribute a noise cancel signal from a transmission signal, a duplexer configured to separate the transmission signal and a reception signal, and a second coupler configured to combine the noise cancel signal with the reception signal and output the combined signal. The phase adjustment circuit and the attenuator are inserted in a transmission path for the noise cancel signal.

With this configuration, the noise cancel signal can be made to have a desired amplitude and a desired phase, whereby components of the transmission signal contained in the reception signal can be effectively attenuated.

According to the present disclosure, an attenuator capable of adjusting attenuation without necessarily harmonic distortion being generated can be easily realized in a simple configuration.

DETAILED DESCRIPTION

Figure 1:
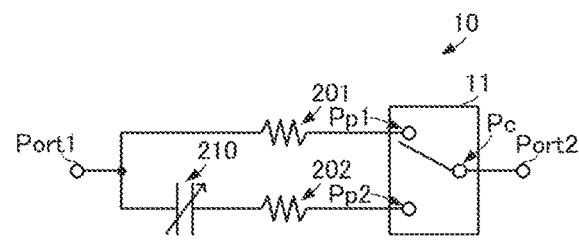
FIG. 1 is a circuit diagram of an attenuator according to a first embodiment of the present disclosure.

An attenuator according to a first embodiment of the present disclosure will be described with reference to the drawings. FIG. 1 is a circuit diagram of an attenuator according to the first embodiment of the present disclosure.

An attenuator 10 includes a switch circuit 11, resistors 201 and 202, and a variable capacitor 210.

The switch circuit 11 includes a shared terminal Pc and selection target terminals Pp1, Pp2. The switch circuit 11 selectively connects the selection target terminals Pp1 and Pp2 to the shared terminal Pc.

The shared terminal Pc is connected to a second high frequency signal input-output terminal "Port2" of the attenuator 10.

The selection target terminal Pp1 is connected to one end of the resistor 201. The other end of the resistor 201 is connected to a first high frequency signal input-output terminal "Port1" of the attenuator 10. In other words, the resistor 201 is connected in series between the first high frequency signal input-output terminal Port1 and the selection target terminal Pp1.

The selection target terminal Pp2 is connected to one end of the resistor 202. The other end of the resistor 202 is connected to one end of the variable capacitor 210. The other end of the variable capacitor 210 is connected to the first high frequency signal input-output terminal Port1. In other words, a series circuit of the resistor 202 and the variable capacitor 210 is connected in series between the first high frequency signal input-output terminal Port1 and the selection target terminal Pp2.

The variable capacitor 210 is constituted of a BST (Barium Strontium Titanate) capacitor, a MEMS (Micro Electro Mechanical Systems) capacitor, or the like. In other words, it is sufficient for the variable capacitor 210 to be a capacitor that does not have a semiconductor diode mechanism. Capacitance of the variable capacitor 210 can be adjusted in accordance with a control signal from the exterior.

With the configuration discussed above, in a first mode in which the selection target terminal Pp1 is connected to the shared terminal Pc, impedance of the attenuator 10 is equal to a resistance value of the resistor 201. Meanwhile, in a second mode in which the selection target terminal Pp2 is connected to the shared terminal Pc, the impedance of the attenuator 10 is equal to the impedance obtained by the addition of a resistance value of the resistor 202 and impedance of the variable capacitor 210.

Here, causing the impedance realized in the second mode to differ from the impedance realized in the first mode makes it possible to increase impedance types that the attenuator 10 can realize.

Further, it is advisable that both the selection target terminals Pp1 and Pp2 can be connected to the shared terminal Pc. In this case, the circuit configuration is such that the resistor 201 is connected in parallel to the series circuit of the resistor 202 and the variable capacitor 210; as such, impedance corresponding to this circuit configuration can be realized. This makes it possible to further increase impedance types that the attenuator 10 can realize.

In addition, by configuring the variable capacitor 210 without necessarily including a semiconductor diode, the generation of distortion caused by a high frequency signal of high power can be suppressed. With this, the attenuator that is excellent in electric power handling capability and is more likely to obtain desired impedance can be realized.

Figure 6:
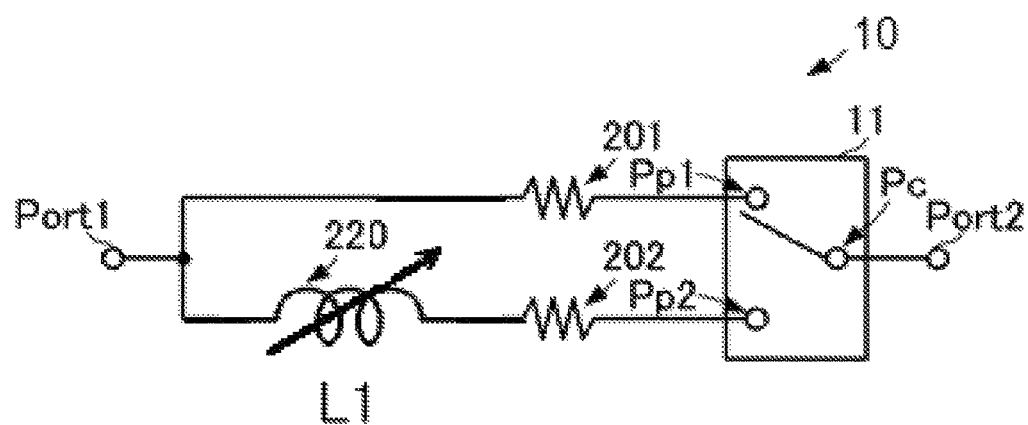
FIG. 6 is a circuit diagram of an attenuator according to a modified first embodiment of the present disclosure using a variable inductor.

Although such an example is cited in the present embodiment that impedance types which the attenuator 10 can realize are increased by using a variable capacitor, the same effect as in the case of using the variable capacitor can be also obtained by using a variable inductor 220 (illustrated in FIG. 6) without necessarily using the variable capacitor. That is, the effect of the present embodiment can be obtained by using a variable reactance element capable of changing the reactance between the first high frequency signal input-output terminal Port1 and the resistor 202.

In the present embodiment, although a configuration in which a variable capacitor is connected in series to one of the plurality of resistors constituting the attenuator is discussed, the effect of the present disclosure can also be obtained by connecting the variable capacitor to the resistor in parallel.

Figure 2:
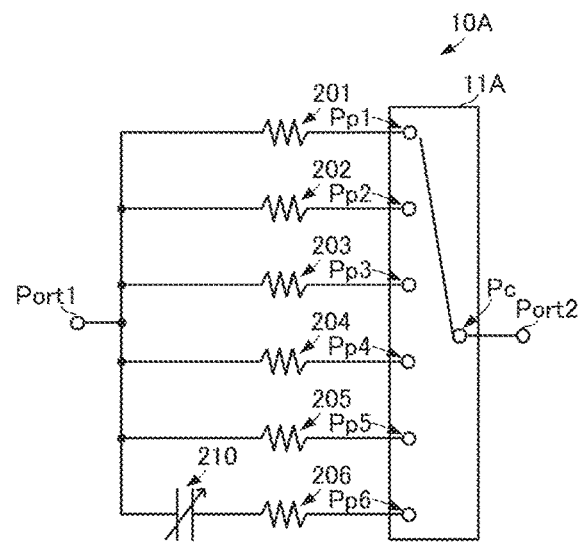
FIG. 2 is a circuit diagram of an attenuator according to a second embodiment of the present disclosure.

Next, an attenuator according to a second embodiment of the present disclosure will be described with reference to the drawings. FIG. 2 is a circuit diagram of an attenuator according to the second embodiment of the present disclosure.

In an attenuator 10A according to the second embodiment of the present disclosure, the number of resistors and the number of selection target terminals in a switch circuit 11A differ from those of the attenuator 10 according to the first embodiment, and other basic constituent elements thereof are the same as those of the attenuator 10 according to the first embodiment.

The attenuator 10A includes the switch circuit 11A, resistors 201, 202, 203, 204, 205, and 206, and a variable capacitor 210.

The switch circuit 11A includes a shared terminal Pc and selection target terminals Pp1, Pp2, Pp3, Pp4, Pp5, and Pp6. The switch circuit 11A selectively connects one of the selection target terminals Pp1 through Pp6 to the shared terminal Pc.

The shared terminal Pc is connected to a second high frequency signal input-output terminal Port2 of the attenuator 10.

The resistor 201 is connected in series between a first high frequency signal input-output terminal Port1 and the selection target terminal Pp1. The resistor 202 is connected in series between the first high frequency signal input-output terminal Port1 and the selection target terminal Pp2. The resistor 203 is connected in series between the first high frequency signal input-output terminal Port1 and the selection target terminal Pp3. The resistor 204 is connected in series between the first high frequency signal input-output terminal Port1 and the selection target terminal Pp4. The resistor 205 is connected in series between the first high frequency signal input-output terminal Port1 and the selection target terminal Pp5. A series circuit of the resistor 206 and the variable capacitor 210 is connected in series between the first high frequency signal input-output terminal Port1 and the selection target terminal Pp6.

With the above configuration, more various types of impedance can be realized.

Figure 3:
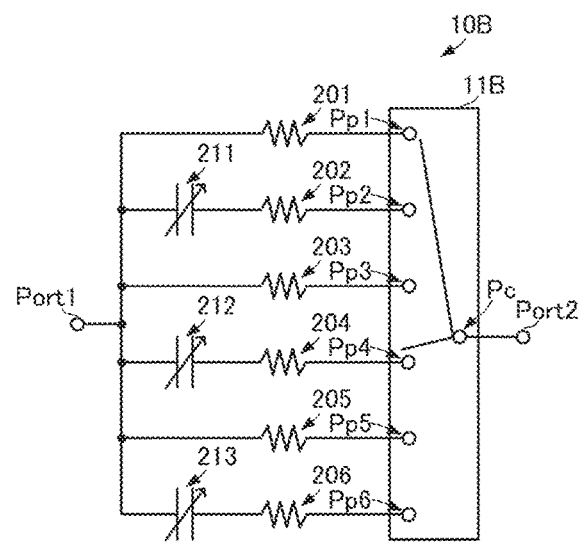
FIG. 3 is a circuit diagram of an attenuator according to a third embodiment of the present disclosure.

Next, an attenuator according to a third embodiment of the present disclosure will be described with reference to the drawings. FIG. 3 is a circuit diagram of an attenuator according to the third embodiment of the present disclosure.

In an attenuator 10B according to the third embodiment of the present disclosure, the number of variable capacitors and the configuration of a switch circuit 11B differ from those of the attenuator 10A according to the second embodiment, and other basic constituent elements thereof are the same as those of the attenuator 10A according to the second embodiment.

The switch circuit 11B selectively connects at least one of selection target terminals Pp1 through Pp6 to a shared terminal Pc1. Alternatively, the switch circuit 11B connects all the selection target terminals Pp1 through Pp6 to the shared terminal Pc.

Variable capacitors 211, 222, and 223 have the same structure as the variable capacitors 210 discussed in the first and second embodiments. Capacitance ranges that the variable capacitors 211, 212, and 213 can respectively have, that is, impedance ranges, may be different from each other, may partially overlap with each other, or may be the same.

The resistor 201 is connected in series between a first high frequency signal input-output terminal Port1 and the selection target terminal Pp1. A series circuit of the resistor 202 and the variable capacitor 211 is connected in series between the first high frequency signal input-output terminal Port1 and the selection target terminal Pp2. The resistor 203 is connected in series between the first high frequency signal input-output terminal Port1 and the selection target terminal Pp3. A series circuit of the resistor 204 and the variable capacitor 212 is connected in series between the first high frequency signal input-output terminal Port1 and the selection target terminal Pp4. The resistor 205 is connected in series between the first high frequency signal input-output terminal Port1 and the selection target terminal Pp5. A series circuit of the resistor 206 and the variable capacitor 213 is connected in series between the first high frequency signal input-output terminal Port1 and the selection target terminal Pp6.

With the above configuration, further various types of impedance can be realized.

Although, in the second and third embodiments, the case where the number of the selection target terminals and the number of the resistors are six is discussed, the numbers thereof may be other plural numbers than six.

Figure 4:
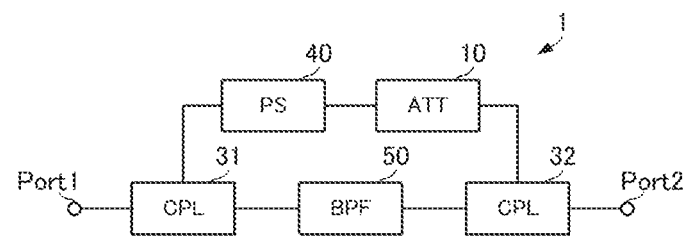
FIG. 4 is a circuit diagram of a high frequency circuit according to a fourth embodiment of the present disclosure.

Next, a high frequency circuit according to a fourth embodiment of the present disclosure will be described with reference to the drawings. FIG. 4 is a circuit diagram of a high frequency circuit according to the fourth embodiment of the present disclosure.

A high frequency circuit 1 according to the present embodiment includes an attenuator 10, coupler circuits 31 and 32, a variable phase-shift circuit 40, and a band pass filter 50.

The coupler circuit 31 is connected to a first high frequency signal input-output terminal Port1. The coupler circuit 31 is, for example, a circuit in which a main line and a sub line are coupled and which is capable of distributing, to the sub line, a desired frequency component of a high frequency signal travelling in the main line. The main line of the coupler circuit 31 is connected to a main line of the coupler circuit 32 through the band pass filter 50.

The band pass filter 50 is set so that a fundamental frequency of the high frequency signal travelling in the main line falls within a passing region while a desired noise component falls within an attenuation region.

The variable phase-shift circuit 40 is connected to the sub line of the coupler circuit 31. The variable phase-shift circuit 40 adjust a noise cancel signal, which is a high frequency signal propagated to the sub line, to a desired phase. The variable phase-shift circuit 40 corresponds to a phase adjustment circuit of the present disclosure.

The attenuator 10 is connected to the variable phase-shift circuit 40. The attenuator 10 has any one of the configurations having been discussed in the aforementioned embodiments. The attenuator 10 attenuates the amplitude of the noise cancel signal to a desired level of amplitude.

The attenuator 10 is connected to a sub line of the coupler circuit 32.

A main line of the coupler circuit 32 is connected to the band pass filter 50 and a second high frequency signal input-output terminal Port2. The coupler circuit 32 combines the high frequency signal from the band pass filter 50 (high frequency signal propagating in the main line) and the noise cancel signal from the attenuator 10 (high frequency signal propagating in the sun line). This makes it possible to further suppress the noise component of the high frequency signal propagating in the main line. The high frequency signal in which the noise component is suppressed is outputted from the second high frequency input-output terminal Port2.

In the high frequency circuit 1 as configured above, the amplitude of the noise cancel signal can be so adjusted as to match the amplitude of the noise component of the high frequency signal propagating in the main line by using the above-mentioned attenuator. This makes it possible to more surely suppress the noise component.

Figure 5:
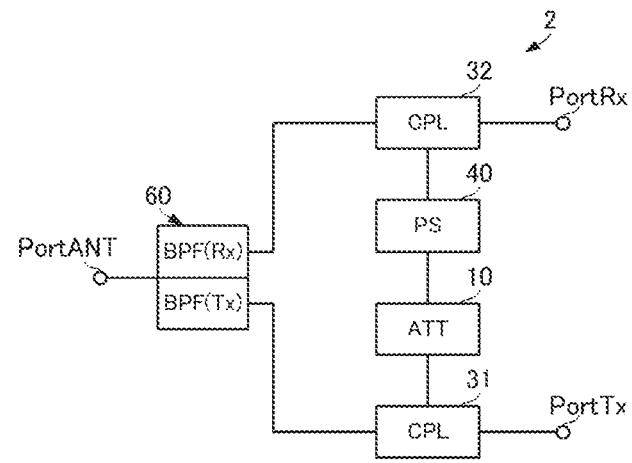
FIG. 5 is a circuit diagram of a high frequency circuit according to a fifth embodiment of the present disclosure.

Next, a high frequency circuit according to a fifth embodiment of the present disclosure will be described with reference to the drawings. FIG. 5 is a circuit diagram of a high frequency circuit according to the fifth embodiment of the present disclosure.

A high frequency circuit 2 according to the present embodiment includes an attenuator 10, coupler circuits 31 and 32, a variable phase-shift circuit 40, and a duplexer 60.

The coupler circuit 31 is connected to a transmission signal input terminal PortTx. The coupler circuit 31 is, for example, a circuit in which a main line and a sub line are coupled and which is capable of distributing, to the sub line, a desired frequency component of a high frequency signal travelling in the main line. The main line of the coupler circuit 31 is connected to a transmission-side band pass filter BPF(Tx) of the duplexer 60. The transmission-side band pass filter BPF(Tx) is connected to an antenna terminal "PortANT". The transmission-side band pass filter BPF(Tx) is set so that a fundamental frequency of a transmission signal falls within a passing region while harmonic components of the transmission signal fall within an attenuation region.

A reception-side band pass filter BPF(Rx) of the duplexer 60 is connected to the antenna terminal PortANT and is also connected to a main line of the coupler circuit 32. The reception-side band pass filter BPF(Rx) is set so that a fundamental frequency of a reception signal falls within a pass band while other frequency components, for example, frequencies of the transmission signal fall within an attenuation region.

The variable phase-shift circuit 40 is connected to the sub line of the coupler circuit 31. The variable phase-shift circuit 40 adjusts a noise cancel signal including the transmission signal component propagated to the sub line to a desired phase.

The attenuator 10 is connected to the variable phase-shift circuit 40. The attenuator 10 has any one of the configurations having been discussed in the aforementioned embodiments. The attenuator 10 attenuates the amplitude of the noise cancel signal to a desired level of amplitude.

The attenuator 10 is connected to a sub line of the coupler circuit 32.

A main line of the coupler circuit 32 is connected to the reception-side band pass filter BPF(Rx) of the duplexer 60 and a reception signal output terminal PortRx. The coupler circuit 32 combines the reception signal from the reception-side band pass filter BPF(Rx) (high frequency signal propagating in the main line) and the noise cancel signal from the attenuator 10 (high frequency signal propagating in the sub line). This makes it possible to suppress unwanted wave components contained in the reception signal propagating in the main line (for example, a leakage component of the transmission signal coming from the duplexer 60). The reception signal in which unwanted wave components are suppressed is outputted from the reception signal output terminal Port2.

In the high frequency circuit 2 configured as discussed above, using the aforementioned attenuator makes it possible to adjust the amplitude of the noise cancel signal to match the amplitude of unwanted wave components of the reception signal propagating in the main line. Through this, the unwanted wave components can be more surely suppressed, thereby making it possible to realize a high frequency front end circuit that is excellent in reception sensitivity. In particular, the configuration of the present embodiment effectively acts in a high frequency front end circuit that performs carrier aggregation in which a transmission signal and a reception signal are respectively transmitted and received at the same time.

REFERENCE SIGNS LIST 1, 2 HIGH FREQUENCY CIRCUIT
10, 10A, 10B ATTENUATOR
11, 11A, 11B SWITCH CIRCUIT
201, 202, 203, 204, 205, 206 RESISTOR
210 VARIABLE CAPACITOR
220 VARIABLE INDUCTOR
31, 32 COUPLER CIRCUIT
40 VARIABLE PHASE-SHIFT CIRCUIT
50 BAND PASS FILTER
60 DUPLEXER

The invention claimed is:

1. An attenuator comprising:
a first high frequency signal input-output terminal and a second high frequency signal input-output terminal;
a plurality of resistors respectively connected to the first high frequency signal input-output terminal, the plurality resistors being parallel to each other;
a switch circuit comprising a plurality of selection target terminals respectively connected to each of the plurality of resistors, and a shared terminal to which the plurality of selection target terminals are selectively connected, the shared terminal being connected to the second high frequency signal input-output terminal; and
a variable reactance element that is connected in series to at least one of the plurality of resistors, wherein at least another one of the plurality of resistors is connected in parallel to a series circuit of the at least one of the plurality of resistors and the variable reactance element.

2. The attenuator according to claim 1, wherein the variable reactance element is a variable capacitor that does not have a diode structure.

3. The attenuator according to claim 1, wherein the variable reactance element is a variable inductor.

4. The attenuator according to claim 1, wherein the switch circuit selects one of the plurality of selection target terminals and connects the selected target terminal to the shared terminal.

5. The attenuator according to claim 2, wherein the switch circuit selects one of the plurality of selection target terminals and connects the selected target terminal to the shared terminal.

6. The attenuator according to claim 1, wherein the switch circuit connects at least two of the plurality of selection target terminals to the shared terminal at the same time.

7. The attenuator according to claim 2, wherein the switch circuit connects at least two of the plurality of selection target terminals to the shared terminal at the same time.

8. The attenuator according to claim 2, wherein the variable capacitor is a Barium Strontium Titrate (BST) capacitor or a Micro Electro Mechanical Systems (MEMS) capacitor.

9. The attenuator according to claim 1, wherein the variable reactance element is connected in parallel to the at least one of the plurality of resistors.

10. A high frequency circuit comprising:
the attenuator according to claim 1;
a phase adjustment circuit;
a first coupler configured to distribute an inputted high frequency signal to a main signal and to a noise cancel signal; and
a second coupler configured to combine the main signal and the noise cancel signal and output the combined signal,
wherein the phase adjustment circuit and the attenuator are in a transmission path of the noise cancel signal.

11. A high frequency circuit comprising:
the attenuator according to claim 1;
a phase adjustment circuit;
a first coupler configured to distribute a noise cancel signal from a transmission signal;
a duplexer configured to separate the transmission signal and a reception signal; and
a second coupler configured to combine the noise cancel signal with the reception signal and output the combined signal,
wherein the phase adjustment circuit and the attenuator are in a transmission path of the noise cancel signal.

* * * * *